US007248105B2

(12) United States Patent
Koen

(10) Patent No.: US 7,248,105 B2
(45) Date of Patent: Jul. 24, 2007

(54) METHOD AND CIRCUIT FOR INPUT OFFSET CORRECTION IN AN AMPLIFIER CIRCUIT

(75) Inventor: Myron J. Koen, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 197 days.

(21) Appl. No.: 11/097,856

(22) Filed: Apr. 1, 2005

(65) Prior Publication Data

US 2006/0220734 A1 Oct. 5, 2006

(51) Int. Cl.
*H03F 1/02* (2006.01)

(52) U.S. Cl. ......................... 330/9; 330/69; 330/124 R

(58) Field of Classification Search ..................... None
See application file for complete search history.

(56) References Cited

U.S. PATENT DOCUMENTS

| | | | | |
|---|---|---|---|---|
| 4,047,122 | A * | 9/1977 | Rao | 330/124 R |
| 5,515,001 | A * | 5/1996 | Vranish | 330/69 |
| 5,841,318 | A * | 11/1998 | Cram | 330/9 |
| 5,880,618 | A | 3/1999 | Koen | |
| 6,229,375 | B1 | 5/2001 | Koen | |

OTHER PUBLICATIONS

Toumazou, C. et al., Extending voltage-mode op amps to current-mode performance, IEE Proceedings, vol. 137, Pt. G, No. 2, Apr. 1990, pp. 116-130.

* cited by examiner

*Primary Examiner*—Khanh Van Nguyen
(74) *Attorney, Agent, or Firm*—Wade J. Brady, III; Frederick J. Telecky, Jr.

(57) ABSTRACT

A method and circuit for eliminating input voltage offset in an amplifier circuit are provided. An exemplary offset correction circuit is configured with DC restoration to eliminate the DC input voltage offset by suitably providing a correction voltage to correct an input voltage offset during operation of the amplifier circuit, without realizing recovery time problems associated with AC coupling. An exemplary offset correction circuit is configured with DC restoration and comprises a timing circuit, a sample and hold circuit, and a feedback circuit to provide a correction voltage signal to correct input voltage offset. The timing circuit is configured to determine a "dead time" and "live time" for operation of the amplifier circuit. During the "dead time" period the sample and hold circuit will sample a differential signal across the DC coupling and provide a feedback signal through feedback circuit to correct input offset voltage. During the "live time" operation of the amplifier circuit, the sample and hold circuit operates to hold the level of correction voltage provided by the feedback circuit to suitably maintain a low input voltage offset.

9 Claims, 3 Drawing Sheets

400
IN+
IN-
A3
A4
A1
A2
A
B
RDC
R1
R2
422
420
402
M1
M2
404
M4
M3
C1
C2
VCM
406
A5
A6
C3
C4
R3
R4
408
C5
C6
M5
M6
414
A7
A8
412
D-FLIP
FLOP
D
Q
Q'
430
432
434
CLOCK
M9
M10
VBIAS
M11
C7
C8
M7
M8
410

METHOD AND CIRCUIT FOR INPUT OFFSET CORRECTION IN AN AMPLIFIER CIRCUIT

FIELD OF INVENTION

This invention generally relates to amplifier circuits and more particularly to a method and circuit for eliminating input offset in an amplifier circuit.

BACKGROUND OF THE INVENTION

Amplifiers are commonly used to provide gain to an input signal. For example, if a voltage amplifier has a voltage gain of 10, then an input signal of 50 millivolts ("mV") applied to the voltage amplifier results in an output signal of 500 mV. An amplifier typically has a range in which the amplifier operates in a linear manner. For example, a voltage amplifier connected to a 5-volt power supply may be linear for outputs up to 4.5 volts. However, driving output voltages greater than 4.5 volts may force the amplifier into non-linearity, resulting in overload of the amplifier and thus potential inaccuracy. In addition to linearity and noise concerns that can affect accuracy, many amplifier circuits can also be susceptible to input offset. For example, even an input offset of a few millivolts can greatly affect the accuracy of the amplifier circuit.

Many amplifier circuits, such as instrumentation amplifiers, generate a current signal between two amplifier devices through a direct connected resistor. For a direct connection of the resistor between the amplifier devices using DC coupling techniques, such amplifier circuits can generally operate without difficulty so long as the gain of the amplifier circuit is low. However, if the gain in the amplifier circuit is high, then large offset can occur to decrease accuracy of the amplifier circuit.

To address large voltage offset, AC coupling is often implemented, such as through capacitive coupling with the addition of a capacitor configured between the amplifier devices. In many instances, the capacitor is provided external to the integrated circuit chip containing the amplifier circuits, particularly if the capacitor exceeds 200 pF in value. As a result of an additional bond pad that is utilized and the accumulated stray capacitance, mainly due to the need to configure the bond pad to allow for the connection of the external capacitor, the capacitive loading of the external wiring connections becomes unequal. When the capacitive loading becomes unequal, the ability to achieve low, even harmonic distortion and/or operate within the linear region becomes extremely difficult to obtain.

Unfortunately, even in an instance when the amplifier circuit utilizing AC coupling is able to operate within the linear region, the AC coupling can still cause difficulty in the recovery time of the amplifier circuit, such as difficulty in the identification of a closely-coupled in time small signal following a large pulse signal. Moreover, in high-gain, if the voltage offset is too high, the voltage offset may be amplified to such unacceptably large values that AC coupling techniques cannot restore the amplifier to proper function. Thus DC coupling techniques may be more desirable in many instances due to the close signal interaction and improved recovery time. Unfortunately, conventional DC coupling techniques are limited in their ability to eliminate input offset voltage.

SUMMARY OF THE INVENTION

In accordance with various aspects of the present invention, a method and circuit for eliminating input voltage offset in an amplifier circuit are provided. An exemplary offset correction circuit is configured with DC restoration to eliminate the DC input voltage offset by suitably providing a correction voltage to correct an input voltage offset during operation of the amplifier circuit, without realizing recovery time problems associated with AC coupling.

In accordance with an exemplary embodiment, an exemplary amplifier circuit comprises a pair of amplifier devices and an offset correction circuit. The pair of amplifier devices is configured with DC coupling, comprising a DC-coupled resistor, for generating a current signal. The offset correction circuit is configured with DC restoration and comprises a timing circuit, a sample and hold circuit, and a feedback circuit to provide a correction voltage signal to correct input voltage offset. The timing circuit is configured to determine a "dead time" and "live time" for operation of the amplifier circuit. During the "dead time" period the sample and hold circuit will sample a differential signal across the DC coupling and provide a feedback signal through feedback circuit to correct input offset voltage. During the "live time" operation of the amplifier circuit, the sample and hold circuit operates to hold the level of correction voltage provided by the feedback circuit to suitably maintain a low input voltage offset.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention will be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application in which DC coupling is desired. However, for purposes of illustration only, exemplary embodiments of the present invention will be described herein in connection with instrumentation amplifiers. Further, it should be noted that while various components may be suitably coupled or connected to other components within exemplary circuits, such connections and couplings can be realized by direct connection between components, or by connection through other components or devices located in between.

In accordance with various aspects of the present invention, a method and circuit for eliminating input voltage offset in an amplifier circuit are provided. An exemplary offset correction circuit is configured with DC restoration to eliminate the DC input voltage offset by suitably providing a correction voltage to correct an input voltage offset during operation of the amplifier circuit, without realizing recovery time problems associated with AC coupling.

Figure 1:
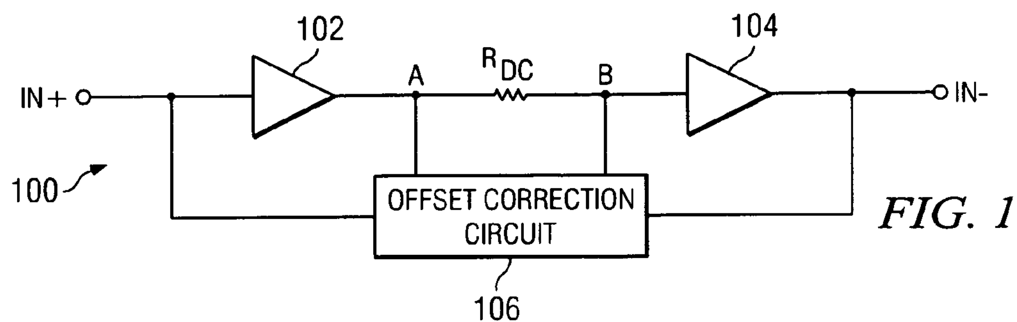
FIG. 1 illustrates a block diagram of an exemplary amplifier circuit configured with a DC restoration circuit in accordance with an exemplary embodiment of the present invention.
Figure 2:
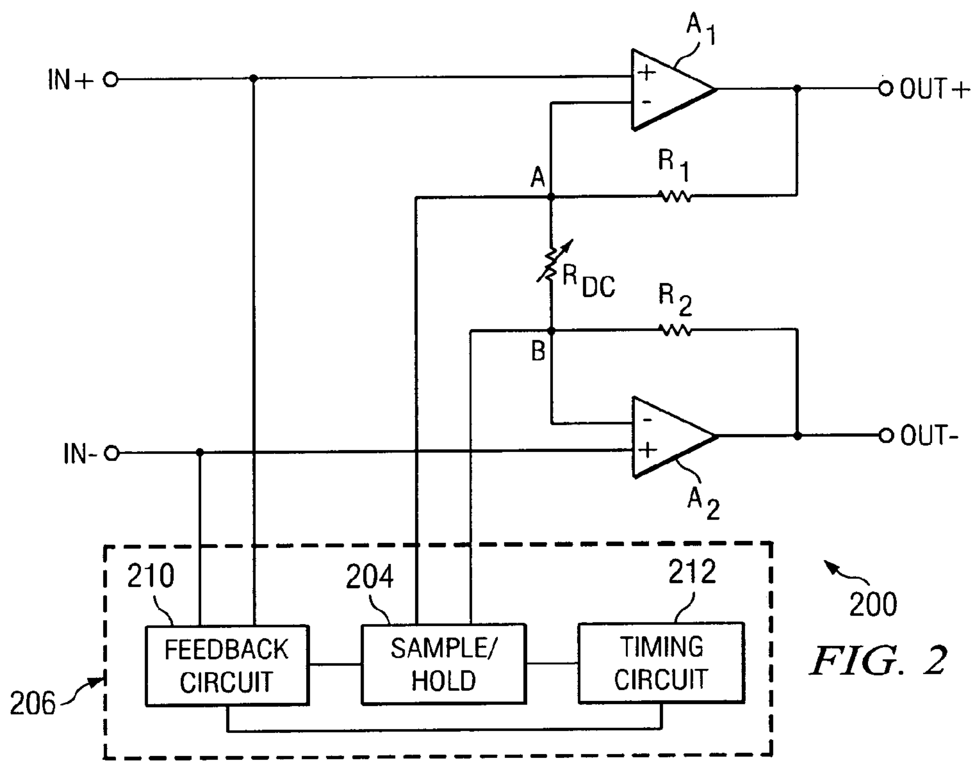
FIG. 2 illustrates a schematic and block diagram of an exemplary amplifier circuit configured with a DC restoration circuit in accordance with an exemplary embodiment of the present invention.

For example, with reference to FIG. 1, in accordance with an exemplary embodiment, an amplifier circuit 100 comprises a first amplifier device 102, a second amplifier device 104 and a DC restoration circuit 106. First amplifier device 102 and second amplifier device 104 are DC coupled by a DC resistor $R_{DC}$ for generating an output signal. Amplifier devices 102 and 104 can comprise various amplifier circuit configurations, such as instrumentation amplifiers, differential amplifiers or any other amplifier configuration. For example, with momentary reference to FIG. 2, an amplifier circuit 200 can comprise a first amplifier $A_1$ and a second amplifier $A_2$ configured in an instrumentation amplifier arrangement. However, amplifier circuit 100 can comprise any circuit configuration capable of DC coupling for addressing input offset voltage.

With reference again to FIG. 1, offset correction circuit 106 is configured to sample a differential signal across DC coupling resistor $R_{DC}$ configured between nodes A and B of amplifier devices 102 and 104, and provide a correction voltage to input terminals $IN^+$ and $IN^-$ of amplifiers 102 and 104, respectively. Offset correction circuit 106 is configured to generate a correction voltage signal during a "dead time" period and provide a substantially constant correction voltage signal during a "live time" period of operation of amplifier circuit 100; A "dead time" period corresponds to the period of time when useable input signal is not flowing through amplifier 100, e.g., when no input signal is being received at input terminals $IN^+$ and $IN^-$ of amplifiers 102 and 104, while a "live time" period corresponds to the period of time when an input signal is being received by amplifier 100 during normal operation. During the "dead time" period, offset correction circuit 106 provides a feedback signal based on the sampled differential signal to correct input offset voltage, while during the "live time" offset correction circuit 106 operates to hold the level of correction voltage fed back to suitably maintain a low input voltage offset.

Offset correction circuit 106 can comprise various configurations. For example, with reference to FIG. 2, an offset correction circuit 206 can be configured with a timing circuit 212, a sample and hold circuit 204 and a feedback circuit 210. Timing circuit 212 is configured to determine the "dead time" and "live time" periods for operation of amplifier circuit 200, and can comprise various timing and/or clock devices and circuits. Sample and hold circuit 204 is configured with feedback circuit 210 in a feedback loop to provide a correction voltage to correct input voltage offset in amplifier circuit 200. Feedback circuit 210 is configured to balance out the difference in voltage potential between nodes A and B of amplifier circuit 200.

During a "dead time" sample and hold circuit 204 is configured to sample a differential signal across DC coupling resistor $R_{DC}$ at nodes A and B to determine an amount of input voltage offset and then provide a feedback correction signal through feedback circuit 210 to input terminals $IN^+$ and $IN^-$ to correct input offset voltage. Such a feedback correction signal is generated in an amount to substantially eliminate the input voltage offset, e.g., by balancing the voltage potential between nodes A and B. The feedback correction signal can be suitably fed back through feedback circuit 210 to input terminals $IN^+$ and $IN^-$ through various feedback circuit configurations. At the conclusion of the "dead time", sample and hold circuit 204 operates to hold the level of correction voltage to a substantially constant signal and provide the signal through feedback circuit 210 to suitably maintain a low input voltage offset during the "live time" operation of amplifier circuit 204.

Figure 5:
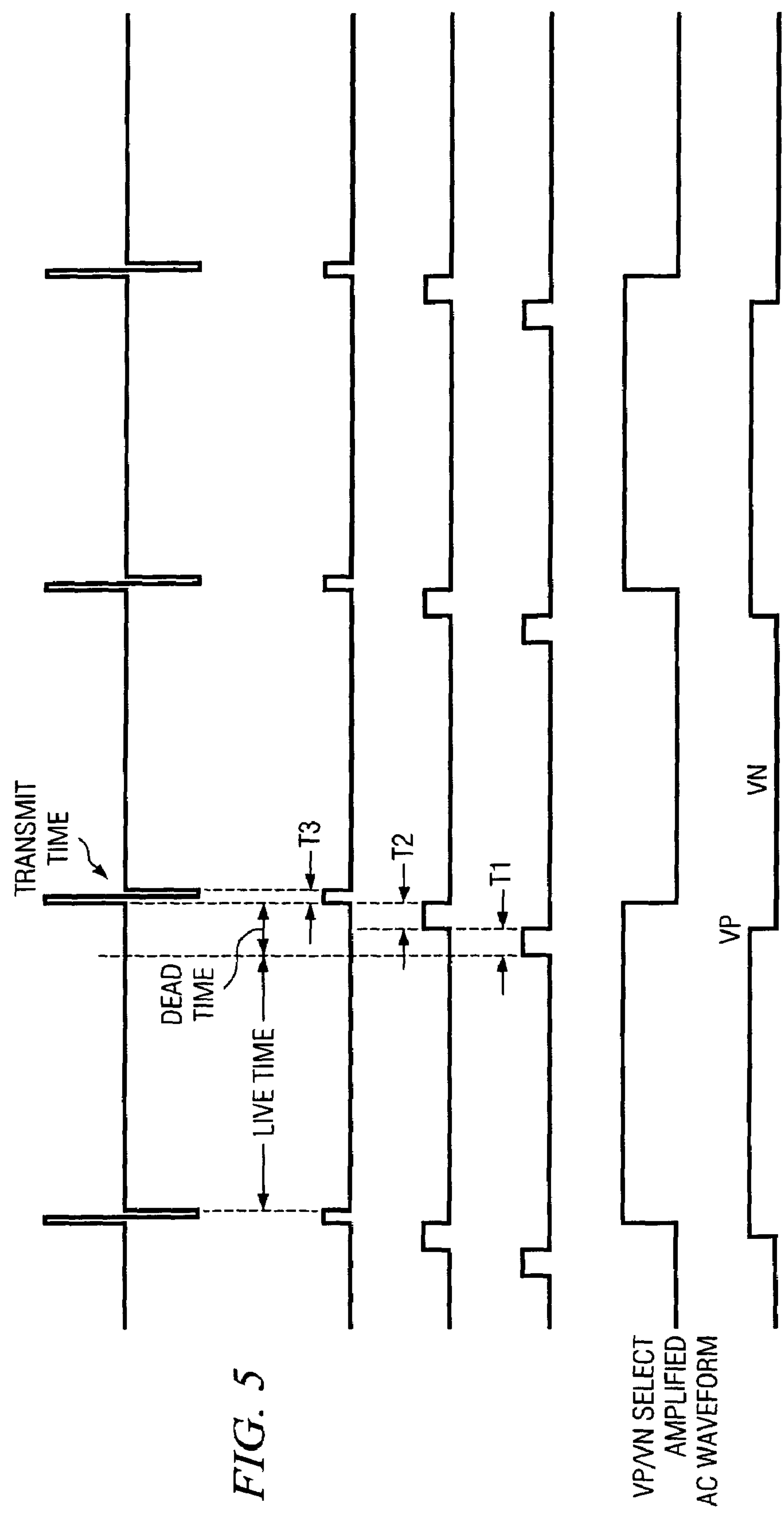
FIG. 5 illustrates a timing diagram of an exemplary amplifier circuit configured with a DC restoration circuit in accordance with an exemplary embodiment of the present invention.

To facilitate the sampling of a differential signal on nodes A and B, sample and hold circuit 204 needs two samples to compute a difference in potential. In accordance with one exemplary embodiment, such sampling can be suitably achieved through two sample and hold circuits configured to sample both nodes A and B separately, and then compute a difference signal. However, such a configuration with two sample and hold circuits to determine the differential signal can potentially produce additional error terms requiring cancellation. In accordance with another exemplary embodiment, sample and hold circuit 204 can be configured with a multiplexor to facilitate sampling of both nodes A and B. A multiplexor can suitably be configured to connect to nodes A and B during alternating time sweeps during a "dead time" period, e.g., during a first time sweep and facilitate sampling by sample and hold circuit 204, and then connect to node B during a second time sweep and facilitate sampling by sample and hold circuit 204. For example, with momentary reference to FIG. 5, an exemplary timing diagram illustrates within a "dead time" period, a first time sweep sampling time T1 for sampling one node and a second time sweep sampling time T2 for sampling the other node. Transmit time T3 is the event associated with the beginning of the "live time". For example, radar and ultrasound systems both begin their measurement cycle (transmission sequence) with the transmission of a burst of electrical energy.

Through the alternating time sampling of nodes A and B by the multiplexor and sample and hold circuit, an AC waveform is created that has an amplitude equal to the difference in potential between nodes A and B. One benefit of having an AC waveform is that the differential signal can be largely amplified to generate an offset correction voltage before restoring the correction signal to a DC signal for input voltage offset correction.

Figure 3:
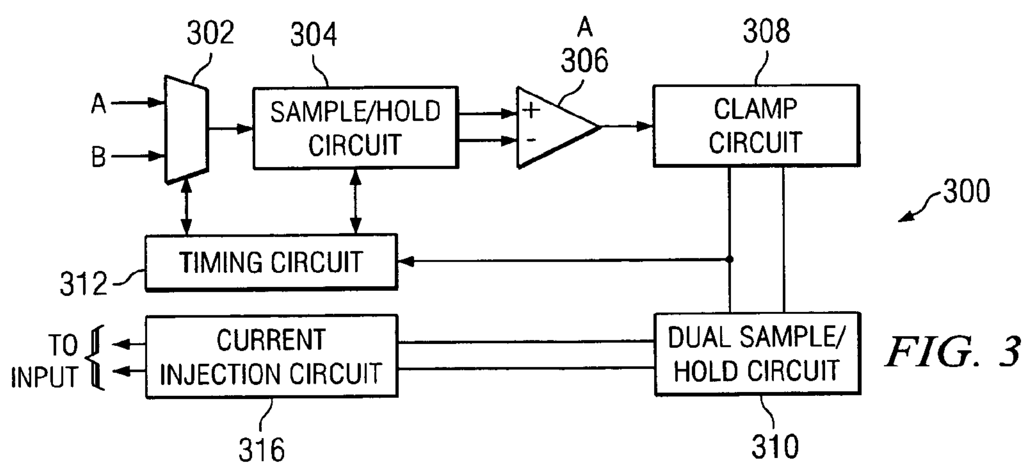
FIG. 3 illustrates a block diagram of an exemplary DC restoration circuit in accordance with an exemplary embodiment of the present invention.
Figure 4:
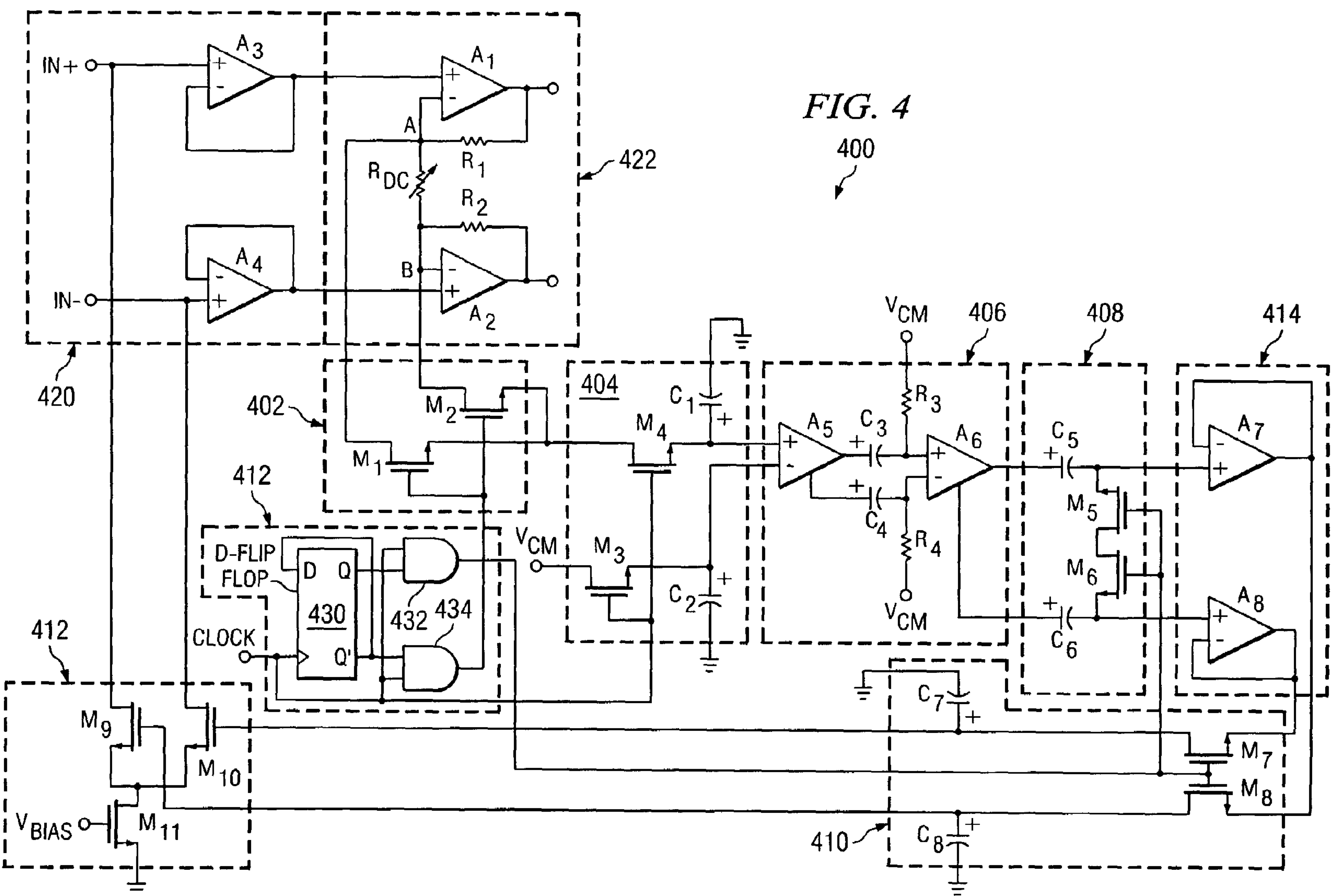
FIG. 4 illustrates a schematic diagram of an exemplary amplifier circuit configured with a DC restoration circuit in accordance with an exemplary embodiment of the present invention.

In accordance with an exemplary embodiment, with reference to FIG. 3, an offset correction circuit 300 comprises a multiplexor 302, a sample and holds circuit 304, a timing circuit 312, and a DC restoration circuit comprising a clamp circuit 308 and a dual sample and hold circuit 310. An exemplary offset correction circuit 300 can be implemented within any amplifier circuit configuration in which DC coupling is used for addressing input offset voltage. For example, with momentary reference to FIG. 4, an exemplary offset correction circuit 300 can be configured within an amplifier circuit comprising an input buffer 420 and an instrumentation amplifier 422. A first amplifier $A_1$ and a second amplifier $A_2$ are configured in an instrumentation amplifier arrangement with DC resistor $R_{DC}$ and resistors $R_1$ and $R_2$. DC resistor $R_{DC}$ can be constant, or can be varied dynamically in various embodiments, such as in many ultrasound applications. Input buffer 420 comprises a first amplifier $A_3$ and a second amplifier $A_4$ configured in a unity gain arrangement, with positive terminals coupled to input terminals $IN^+$ and $IN^-$, respectively, and with negative terminals directly connected to the output of the respective amplifiers. In this exemplary embodiment, input buffer 420 can facilitate the summation of an offset voltage correction signal with the input signal flowing into instrumentation amplifier 422. Other amplifier circuits can be configured without the use of input buffer 420 to provide such summation functions.

With reference again to FIG. 3, multiplexor 302 is configured to facilitate sampling of a difference signal during alternating time sweeps within a "dead time" period, such as by connections to nodes A and B and separately facilitating sampling of the voltage potential at each node. The alternating time sweeps for sampling within the "dead time" can be controlled by timing circuit 312. Multiplexor 302 can comprise various circuit configurations for facilitating dual sampling of the voltage potential at nodes A and B by sample and hold circuit 304.

For example, with momentary reference again to FIG. 4, an exemplary multiplexor 402 can comprise a FET-device $M_1$ and a FET-device $M_2$, with the respective control terminals, i.e., gates, coupled to a timing circuit 412, drain terminals coupled to nodes A and B, respectively, and source terminals coupled together to provide a signal for a sample and hold circuit 404. However, any multiplexor configuration capable of facilitating sampling and holding of a differential signal during a "dead time" and a "live time" may also be utilized in accordance with various other embodiments.

Sample and hold circuit 304 is configured to sample the differential signal across nodes A and B to determine an amount of input voltage offset needed for correction. In the exemplary embodiment, sampling of the differential signal by sample and hold circuit 304 occurs during alternating time sweeps within a "dead time" period, such as by separate connections to nodes A and B through multiplexor 302, to separately sample the voltage potential at each node. During the "live time" period, sample and hold circuit 304 is configured to operate in a "hold" mode to maintain the correction voltage signal to facilitate a low offset. Sample and hold circuit 304 can comprise various circuit configurations for providing the sampling and holding functions, including various switching circuits, capacitance or charge-holding devices.

In accordance with an exemplary embodiment, with momentary reference again to FIG. 4, sample and hold circuit 404 can comprise a FET-device $M_3$ and a FET-device $M_4$, and a pair of holding capacitors $C_1$ and $C_2$. The respective control terminals, i.e., gate terminals, of FET-devices $M_3$ and $M_4$ are coupled to a clock signal CLOCK representative of a time such as T2, with the respective source terminals coupled to upper plates of holding capacitors $C_1$ and $C_2$, as well as to input terminals of an amplifier 406. FET-device $M_4$ has a drain terminal coupled to multiplexor 402, e.g., to the source terminals of FET-devices $M_1$ and $M_2$, while FET-device $M_3$ has a drain terminal coupled to $V_{CM}$ common mode voltage that is configured to bias amplifier $A_5$. Sample and hold circuit 404 can also comprise any other sample and hold circuit configuration for separately sampling the voltage potential at each node A and B to provide a sampled differential signal to amplifier 406.

As discussed, an exemplary timing circuit 312 can comprise any configuration for determining the "dead time" and "live time" periods for operation of an amplifier circuit, and can comprise various timing and/or clock devices and circuits. In accordance with an exemplary embodiment, with momentary reference to FIG. 4, an exemplary timing circuit 412 can comprise a D flip-flop device 430 and a pair of AND gates 432 and 434. D flip-flop device 430 is configured to receive a clock signal CLOCK, and to provide a delayed output Q and an inverted delayed output Q', with an input D coupled to inverted delayed output Q'. AND gates 432 and 434 are configured to receive clock signal CLOCK, as well as delayed output Q and inverted delayed output Q', respectively. The output of AND gate 432 is coupled to a clamp circuit 408 and a dual sample and hold circuit 410, while the output of AND gate 434 is coupled to multiplexor 402. In addition to the exemplary embodiment illustrated in FIG. 4, various other logic devices and configurations can also be suitably implemented to provide the intended functions of timing circuit 312.

As a result of the use of multiplexor 302 and timing circuit 312 for sampling by sample and hold circuit 304, an AC waveform representative of the differential signal is produced by sample and hold circuit 304. The AC waveform comprises an amplitude equal to the difference in potential between nodes A and B. An AC waveform can be suitably amplified to better facilitate generation of a suitably offset correction signal. To provide gain to the AC waveform signal, offset correction circuit 300 can comprise an amplifier 306 coupled to sampling and hold circuit 304. Amplifier 306 can comprise any amplifier configuration. Amplifier 306 can provide a large gain function, such as a gain of 100 to 1000 or more, with the larger gains enabling more accurate determination of the necessary offset correction signal.

In accordance with an exemplary embodiment, amplifier 306 comprises a pair of AC coupled amplifiers configured to eliminate input offset of amplifier 306. For example, with momentary reference again to FIG. 4, an amplifier 406 comprises a first amplifier $A_5$ and a second amplifier $A_6$ coupled with AC coupling capacitors $C_3$ and $C_4$, with capacitor $C_3$ coupled between a first output terminal of first amplifier $A_5$ and the positive terminal of second amplifier $A_6$, and with capacitor $C_4$ coupled between a second output terminal of first amplifier $A_5$ and the negative terminal of second amplifier $A_6$. First amplifier $A_5$ is configured to receive the AC waveform representative of the differential signal, and has a positive input terminal coupled to the source terminal of FET-device $M_4$ and a negative input terminal coupled to the source terminal of FET-device $M_3$. Second amplifier $A_6$ is configured with a pair of resistors $R_3$ and $R_4$ to provide a DC bias to the input of amplifier $A_6$. Each of first amplifier $A_5$ and second amplifier $A_6$ can comprise any amplifier configuration for providing the gain functions to the sampled differential signal.

To restore the amplified AC waveform back to a DC waveform, offset correction circuit 300 can comprise a clamp circuit 308 and a dual sample and hold circuit 310. Clamp circuit 308 is configured to clamp the level of amplitude for the amplified AC waveform on the alternating time cycles to facilitate DC restoration by dual sample and hold circuit 310. Dual sample and hold circuit 310 is suitably configured to receive the clamped signal to generate a DC waveform representative of the offset correction signal needed for input offset correction.

Clamp circuit 308 and dual sample and hold circuit 310 can comprise various circuit configurations for providing the DC restoration function. For example, with momentary reference to FIG. 4, a clamp circuit 408 can comprise a pair of gate-drain-connected FET-devices $M_5$ and $M_6$, and a pair of capacitors $C_5$ and $C_6$, with the source of FET-device $M_5$ coupled through capacitor $C_5$ to a first output terminal of second amplifier $A_6$, and the source of FET-device $M_6$ coupled through capacitor $C_6$ to a second output terminal of second amplifier $A_6$. Clamp circuit 408 can be suitably coupled to dual sample and hold circuit 410 in various manners, such as through direct coupling, or through other devices or circuits, such as through a buffer circuit 414. Buffer circuit 414 comprises a pair of unity gain buffers $A_7$ and $A_8$ configured for buffering of the clamped signal provided to dual sample and hold circuit 410. However, any other buffer configuration, or any other coupling technique, can also be suitably utilized in addition to direct connection between clamp circuit 408 and dual sample and hold circuit 410.

Meanwhile, a dual sample and hold circuit 410 can comprise a FET-device $M_7$ and a FET-device $M_8$, and a pair of holding capacitors $C_7$ and $C_8$. The respective control terminals, i.e., gate terminals, of FET-devices $M_7$ and $M_8$ are coupled to the gate connection of FET-devices $M_5$ and $M_6$ of clamp circuit 408, as well as to timing circuit 412, e.g., to the output of AND-gate 432. The source terminal of FET-device $M_7$ and FET-device $M_8$ are coupled to the source terminals of FET-devices $M_5$ and $M_6$, such as through buffer 414, with the drain terminals of FET-device $M_7$ and FET-device $M_8$ being coupled to holding capacitors $C_7$ and $C_8$, respectively, and are configured to provide the DC offset correction signal through a feedback loop back to the input terminals of the amplifier circuit, e.g., back to input buffer 420. Dual sample and hold circuit 410 can comprise any circuit configuration for providing a dual sample and hold function.

With reference again to FIG. 3, the offset correction signal can suitably be provided through the feedback loop back to the input terminals of an amplifier circuit. As a result of the feedback loop, an overall amplifier circuit tends to operate as a feedback amplifier, allowing offset correction circuit 300 to suitably balance out the voltage differences at nodes A and B, i.e., to zero out the voltage difference at nodes A and B. In addition, the feedback configuration can facilitate the implementation of a variable resistance DC coupling resistor $R_{DC}$ for the amplifier circuit, such as may be desired in many ultrasonic applications.

To provide error correction signals through the feedback loop to the input terminals of the amplifier circuit, such as to an input buffer stage, offset correction circuit 300 can also comprise a current injection circuit 316. Current injection circuit 316 is configured to inject a differential current into the input terminals of the amplifier that is representative of the DC waveform.

Current injection circuit 316 can comprise a current source or any other current injection device or circuit. For example, with momentary reference again to FIG. 4, a current injection circuit 416 comprises a differential current source including FET-devices $M_9$, $M_{10}$ and $M_{11}$, with FET-device $M_{11}$ having a gate-terminal coupled to a bias voltage $V_{BIAS}$, and a drain terminal coupled to the source terminals of FET-devices $M_9$ and $M_{10}$, and with the gate terminals of FET-devices $M_9$ and $M_{10}$ coupled to FET-devices $M_7$ and $M_8$ of dual sample and hold circuit 410. A differential current representative of the DC correction signal can be suitably injected from the drain terminals of FET-devices $M_9$ and $M_{10}$ to input buffer 420, e.g., to the IN+ and IN− terminals of first amplifier $A_3$ and a second amplifier $A_4$, respectively. However, current injection circuit 416 is not limited to a differential current source, and can comprise any circuit for injecting current representative of the DC correction signal. Moreover, a differential current signal or other DC correction signal can be suitably injected into input buffer 420 in various other manners.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by suitably scaling the values of the resistor and capacitive devices within the control circuit. In addition, instead of providing a control circuit for controlling the AC coupling between only two amplifier devices, an exemplary control circuit can be configured for balancing the capacitive loading between more than two amplifier devices. These alternatives can be suitably selected depending upon the particular application or in consideration of any number of factors associated with the operation of the system. Moreover, these and other changes or modifications are intended to be included within the scope of the present invention, as expressed in the following claims.

I claim:

1. A DC coupled amplifier circuit configured for high-gain applications, said amplifier circuit comprising:

a first amplifier and a second amplifier coupled with a DC coupling resistor;

an offset correction circuit configured between said first amplifier and said second amplifier, said offset correction circuit configured, responsive to a signal across said DC coupling resistor, to generate a correction voltage signal for correction of input voltage offset occurring at input terminals of said first amplifier and said second amplifier.

2. The amplifier circuit according to claim 1, wherein said offset correction circuit is configured to generate said correction voltage signal during a dead time period of operation of said amplifier circuit, and to provide a substantially constant correction voltage signal during a live time period of operation of said amplifier circuit.

3. The amplifier circuit according to claim 1, wherein said offset correction circuit comprises:

a timing circuit configured for determining a dead time period and a live time period;

a feedback circuit; and a sample and hold circuit configured to sample a differential signal across said DC coupling resistor during said dead time, and to provide a substantially constant correction voltage signal during said live time.

4. The amplifier circuit according to claim 3, wherein said feedback circuit is configured to balance out voltage differences at nodes configured between said DC coupling resistor and said first amplifier and between said DC coupling resistor and said second amplifier.

5. The amplifier circuit according to claim 3, wherein said sample and hold circuit is configured to alternatively sample voltage differences at said nodes to produce an AC waveform.

6. The amplifier circuit according to claim 5, wherein said offset correction circuit further comprises a DC restoration circuit configured for restoring said AC waveform back into a DC correction signal.

7. The amplifier circuit according to claim 1, wherein said first amplifier and said second amplifier are configured in an instrumentation amplifier arrangement.

8. The amplifier circuit according to claim 1, wherein said offset correction circuit comprises:

a timing circuit configured for determining a dead time period and a live time period;

a multiplexor circuit configured for facilitating sampling of a differential signal across said DC coupling resistor during alternating time sweeps within said dead period;

a sample and hold circuit configured to sample said differential signal across said DC coupling resistor during alternating time sweeps of said dead time, said multiplexor circuit and said sample a hold circuit providing an AC waveform representative of said differential signal; and a DC restoration circuit configured for restoring said AC waveform back into a DC correction signal for correction of input voltage offset occurring at input terminals of said first amplifier and said second amplifier.

9. The amplifier circuit according to claim 8, wherein said DC restoration circuit comprises a clamp circuit and a dual sample and hold circuit.

* * * * *